(12) United States Patent
Kanaya

(10) Patent No.: US 9,467,099 B2
(45) Date of Patent: Oct. 11, 2016

(54) LINEARIZER

(71) Applicant: Mitsubishi Electric Corporation, Tokyo (JP)

(72) Inventor: Ko Kanaya, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 0 days.

(21) Appl. No.: 14/640,407

(22) Filed: Mar. 6, 2015

(65) Prior Publication Data

US 2015/0340999 A1 Nov. 26, 2015

(30) Foreign Application Priority Data

May 23, 2014 (JP) ................................. 2014-107276

(51) Int. Cl.
*H03F 1/32* (2006.01)
*H03F 3/19* (2006.01)

(52) U.S. Cl.
CPC .......... *H03F 1/3241* (2013.01); *H03F 1/3276* (2013.01); *H03F 3/19* (2013.01); *H03F 2200/387* (2013.01); *H03F 2201/3215* (2013.01)

(58) Field of Classification Search
None
See application file for complete search history.

(56) References Cited

U.S. PATENT DOCUMENTS

| | | | | | |
|---|---|---|---|---|---|
| 4,225,827 | A | * | 9/1980 | Davis, Jr. | H03F 1/083 330/149 |
| 4,560,949 | A | * | 12/1985 | Young | H03G 1/0058 330/110 |
| 4,683,443 | A | * | 7/1987 | Young | H03H 7/38 330/277 |
| 4,882,482 | A | * | 11/1989 | Smith | H03F 3/082 250/214 A |
| 5,128,638 | A | * | 7/1992 | Staudinger | H03H 7/48 333/109 |
| 5,506,544 | A | * | 4/1996 | Staudinger | H03F 1/301 330/277 |
| 6,018,266 | A | * | 1/2000 | Wu | H03F 1/3276 330/149 |
| 6,107,877 | A | * | 8/2000 | Miguelez | H03F 1/3276 330/149 |
| 6,166,604 | A |   | 12/2000 | Matsunaga | |
| 6,255,885 | B1 | * | 7/2001 | Brandt | H03F 1/301 327/309 |
| 6,313,701 | B1 | * | 11/2001 | Mussino | H04B 1/62 330/149 |
| 6,577,177 | B2 | * | 6/2003 | Zhou | H03F 1/3276 327/133 |
| 6,710,649 | B2 | * | 3/2004 | Matsumoto | H03F 1/0222 330/124 R |
| 6,985,020 | B2 | * | 1/2006 | Zhou | H03F 1/3276 327/317 |

(Continued)

FOREIGN PATENT DOCUMENTS

| JP | 2000-013150 A | 1/2000 |
|---|---|---|
| JP | 2002-009555 A | 1/2002 |

(Continued)

OTHER PUBLICATIONS

Xie et al., High Linearity GaN Hemt Power Amplifier with Pre-Linearization Gate Diode, 2004, World Scientific Publishing Company, vol. 14, No. 3, 847-852.*

(Continued)

*Primary Examiner* — Thomas J Hiltunen
(74) *Attorney, Agent, or Firm* — Studebaker & Brackett PC

(57) ABSTRACT

A linearizer includes: an input terminal; an output terminal; a connection point connected between the input terminal and the output terminal; a diode connected to the connection point; a voltage terminal; and a resistor connected between the voltage terminal and the connection point, wherein 0 V is applied to the voltage terminal.

6 Claims, 5 Drawing Sheets

(56) References Cited

U.S. PATENT DOCUMENTS

| | | | | |
|---|---|---|---|---|
| 7,420,416 | B2* | 9/2008 | Persson | H03F 1/3276 330/149 |
| 7,907,649 | B2* | 3/2011 | Blauvelt | H04B 10/504 372/29.021 |
| 7,932,782 | B2* | 4/2011 | Lau | H03F 1/0261 330/285 |
| 8,076,994 | B2* | 12/2011 | Farrell | H01L 23/66 330/302 |
| 8,324,971 | B2* | 12/2012 | Gesche | H03F 1/301 330/285 |
| 8,404,508 | B2* | 3/2013 | Lidow | H01L 29/1066 257/E21.409 |
| 8,823,140 | B2* | 9/2014 | Nie | H01L 29/42304 257/565 |
| 8,962,461 | B2* | 2/2015 | Hurkx | H01L 23/3171 257/183 |
| 9,364,846 | B2* | 6/2016 | Tsai | B05B 17/0653 |
| 2006/0017509 | A1* | 1/2006 | Veitschegger | H03F 1/0288 330/285 |
| 2006/0114066 | A1* | 6/2006 | Oka | H03F 1/3276 330/302 |
| 2015/0341000 | A1* | 11/2015 | Kanaya | H03F 1/3258 327/530 |

FOREIGN PATENT DOCUMENTS

| | | |
|---|---|---|
| JP | 2003-332851 A | 11/2003 |
| JP | 2005-073010 A | 3/2005 |
| KR | 2003-0093782 A | 12/2003 |

OTHER PUBLICATIONS

Yamauchi, K. et al.; "A Microwave Miniaturized Linearizer Using a Parallel Diode with a Bias Feed Resistance"; IEEE Transactions of Microwave Theory and Techniques; vol. 45, No. 12; Dec. 1997; pp. 2431-2435.

Yamauchi, K. et al.; "An 18 GHz-band MMIC linearizer using a parallel diode with a bias feed resistance and a parallel capacitor," Microwave Symposium Digest. 2000 IEEE MTT-S International, vol. 3; Jun. 11-16, 2000; pp. 1507-1510.

An Office Action issued by the Korean Patent Office on Jun. 30, 2016, which corresponds to Korean Patent Application No. 10-2015-0065100 and is related to U.S. Appl. No. 14/640,407; with English language partial translation.

\* cited by examiner

LINEARIZER

BACKGROUND OF THE INVENTION

1. Field of the Invention

The present invention relates to a diode linearizer that improves distortion characteristics of a high-frequency amplifier.

2. Background Art

In recent years, research and development into transistors using a nitride semiconductor (e.g., GaN) are being actively carried out, and an application example thereof is a high output amplifier for communication. Amplifiers using GaN are enabled to have higher output than conventional compound semiconductors (e.g., GaAs). However, there is a problem that particularly an AMAM characteristic deteriorates due to GaN-specific soft compression in which a gain slowly decreases from low input power.

There are linearizers using a diode as analog predistortion that compensates for the AMAM characteristic. Among such linearizers, parallel diode linearizers have a simple circuit configuration, are smaller and less power consuming (e.g., see Kazuhisa Yamauchi, Kazutomi Mori, Masatoshi Nakayama, Yasuo Mitsui, and Tadashi Takagi, "A Microwave Miniaturized Linearizer Using a Parallel Diode with a Bias Feed Resistance," IEEE TRANSACTIONS ON MICROWAVE THEORY AND TECHNIQUES, VOL. 45, NO. 12, DECEMBER 1997 and Kazuhisa Yamauchi, Masatoshi Nakayama, Yukio Ikeda, Hiromasa Nakaguro, Naoto Kadowaki, and Takahiko Araki, "AN 18 GHZ-BAND MMIC LINEARIZER USING A PARALLEL DIODE WITH A BIAS FEED RESISTANCE AND A PARALLEL CAPACITOR," 2000 IEEE).

When a linearizer is incorporated in a GaN-based amplifier MMIC using a SiC substrate, a smallest possible circuit is preferred because epitaxial substrates are expensive. Since parallel diode linearizers require only a simple configuration, they are circuits best suited to a GaN-MMIC.

Parallel diode linearizers are normally designed to have reverse characteristics of AMAM and AMPM of amplifiers connected upstream or downstream thereof. The AMAM and AMPM characteristics of a linearizer vary depending on a voltage applied to a diode of the linearizer. For this reason, the linearizer is provided with a control terminal that controls AMAM and AMPM, and controls and/or adjusts an applied voltage of the linearizer according to AMAM and AMPM of the amplifier.

SUMMARY OF THE INVENTION

When a bias is applied to the linearizer, a current flows through an anode electrode of the diode. For this reason, migration occurs in an anode electrode metal, which causes deterioration of reliability. Preventing the migration requires the anode current value to be limited, which restrains a degree of freedom in designing the linearizer.

The present invention has been implemented to solve the above-described problems and it is an object of the present invention to provide a linearizer capable of improving reliability and increasing the degree of freedom of the design thereof.

According to the present invention, a linearizer includes: an input terminal; an output terminal; a connection point connected between the input terminal and the output terminal; a diode connected to the connection point; a voltage terminal; and a resistor connected between the voltage terminal and the connection point, wherein 0 V is applied to the voltage terminal.

In the present invention, only a low anode current of the diode D is required by applying 0 V to the voltage terminal of the linearizer, and it is thereby possible to prevent migration from occurring in the anode electrode metal and improve reliability. Elimination of the need to limit the anode current value allows the degree of freedom in designing the linearizer to improve.

DETAILED DESCRIPTION OF THE PREFERRED EMBODIMENTS

A linearizer according to the embodiments of the present invention will be described with reference to the drawings. The same components will be denoted by the same symbols, and the repeated description thereof may be omitted.

First Embodiment

Figure 1:
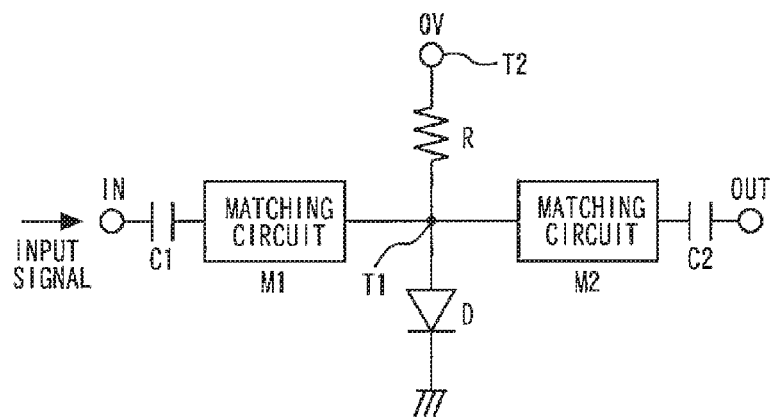
FIG. 1 is a circuit diagram illustrating a linearizer according to a first embodiment of the present invention.

FIG. 1 is a circuit diagram illustrating a linearizer according to a first embodiment of the present invention. A high-frequency signal of a Ku-band is inputted from an input terminal IN. A connection point T1 is connected between the input terminal IN and an output terminal OUT. A capacitor C1 and a matching circuit M1 are connected between the input terminal IN and the connection point T1. A capacitor C2 and a matching circuit M2 are connected between the connection point T1 and the output terminal OUT. The capacitors C1 and C2 are used to cut a DC component. A diode D is connected between the connection point T1 and a grounding point. A resistor R is connected between a voltage terminal T2 and the connection point T1. A resistance value of the resistor R is 2000Ω. 0 V is applied to the voltage terminal T2.

Figure 2:
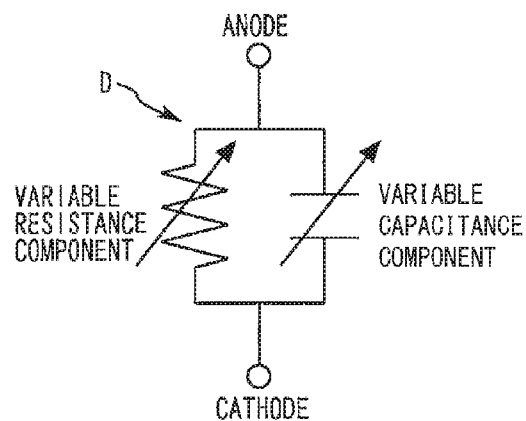
FIG. 2 is a diagram illustrating an equivalent circuit of the diode.
Figure 3:
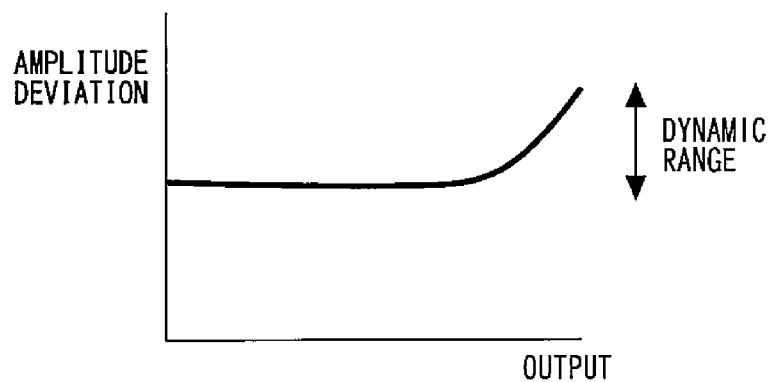
FIG. 3 is a diagram illustrating an AMAM characteristic of the linearizer according to the first embodiment of the present invention.
Figure 4:
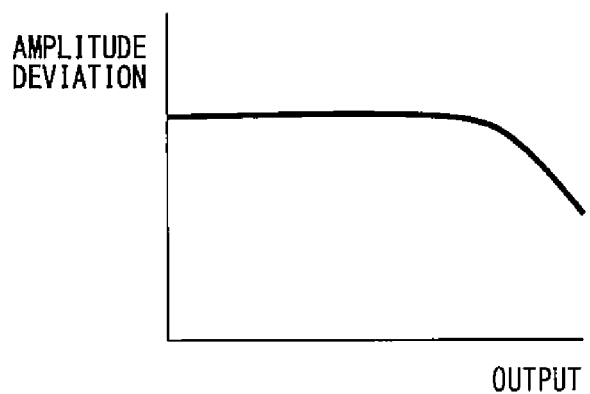
FIG. 4 is a diagram illustrating an AMPM characteristic of the linearizer according to the first embodiment of the present invention.

FIG. 2 is a diagram illustrating an equivalent circuit of the diode. The diode D has a variable resistance component and a variable capacitance component. FIG. 3 is a diagram illustrating an AMAM characteristic of the linearizer according to the first embodiment of the present invention. FIG. 4 is a diagram illustrating an AMPM characteristic of the linearizer according to the first embodiment of the present invention.

When a frequency of an input signal is as high as a Ku band, an impedance ($1/\omega C$) of the capacitance component of the diode D decreases. For this reason, even when a potential of the connection point T1 is 0 V and the impedance of the resistance component is high, the impedance of the diode D decreases. Therefore, since the impedance of the diode D in the case of a small signal is low, loss in the linearizer is large.

On the other hand, in the case of a large signal, a current flows into the diode D in a forward direction, a potential of the connection point T1 shifts from 0 V to a low voltage side, and therefore the impedance of the resistance component increases. When the potential is shifted toward the low voltage side (negative voltage side in the present embodiment), the capacitance component decreases. Therefore, the impedance of the diode D increases and the loss in the linearizer decreases. It is thereby possible to assure a dynamic range of AMAM as shown in FIG. 3. The same operation principles as those described in the aforementioned literatures apply to the AMPM characteristic.

In the present embodiment, only a low anode current of the diode D is required by applying 0 V to the voltage terminal of the linearizer, and it is thereby possible to prevent migration from occurring in the anode electrode metal and improve reliability. Elimination of the need to limit the anode current value allows the degree of freedom in designing the linearizer to improve. In the present embodiment, the cathode of the diode D is grounded, but even when the anode is grounded, only the current direction changes and similar effects can be obtained.

Second Embodiment

Figure 5:
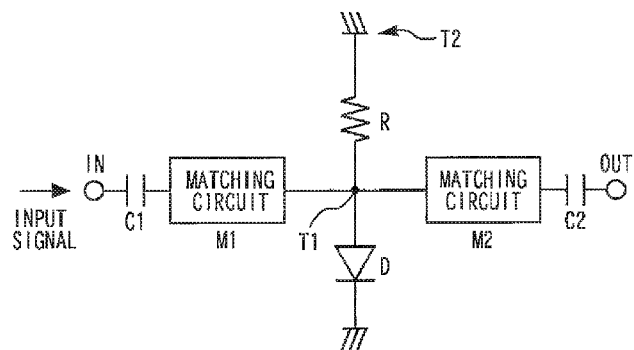
FIG. 5 is a circuit diagram illustrating a linearizer according to a second embodiment of the present invention.

FIG. 5 is a circuit diagram illustrating a linearizer according to a second embodiment of the present invention. A voltage terminal T2 of the linearizer is grounded. A diode D has a HEMT structure in which a drain and a source are short-circuited. The rest of the configuration is similar to that of the first embodiment.

Since the voltage terminal T2 is grounded, no power supply for the linearizer is necessary. A wiring layout in an MMIC is simplified. Therefore, it is possible to simplify and downsize the configuration of the amplifier module, and reduce the cost.

Figure 6:
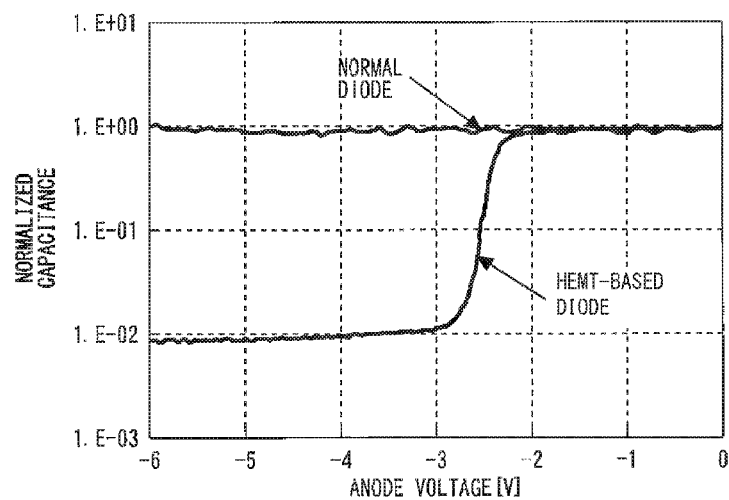
FIG. 6 is a diagram illustrating a relationship between a capacity of the diode and an anode voltage.

FIG. 6 is a diagram illustrating a relationship between a capacity of the diode and an anode voltage. In the present embodiment, the potential is shifted from 0 V which is a bias point to a negative voltage direction. In contrast, with a normal diode, there is substantially no variation in the capacity in a negative voltage region. On the other hand, with a HEMT-based diode (diode whose gate is assumed to be an anode and whose short circuited drain and source are assumed to be a cathode), the capacitance variation is as large as a two-digit figure. Thus, the dynamic range of linearizer characteristics can be increased using an HEMT-based diode having a large variation of the capacitance component with respect to the voltage. Moreover, using an HEMT process diode allows the linearizer and the amplifier to be integrated on an MMIC.

Third Embodiment

Figure 7:
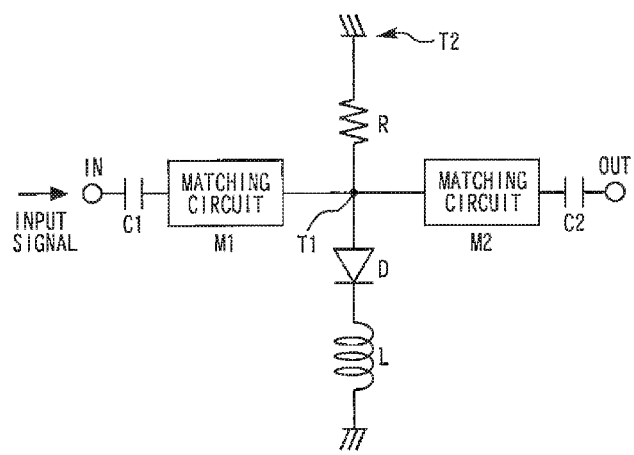
FIG. 7 is a circuit diagram illustrating a linearizer according to a third embodiment of the present invention.

FIG. 7 is a circuit diagram illustrating a linearizer according to a third embodiment of the present invention. An inductor L is connected between a cathode of a diode D and a grounding point. The rest of the configuration is similar to that of the second embodiment.

Figure 8:
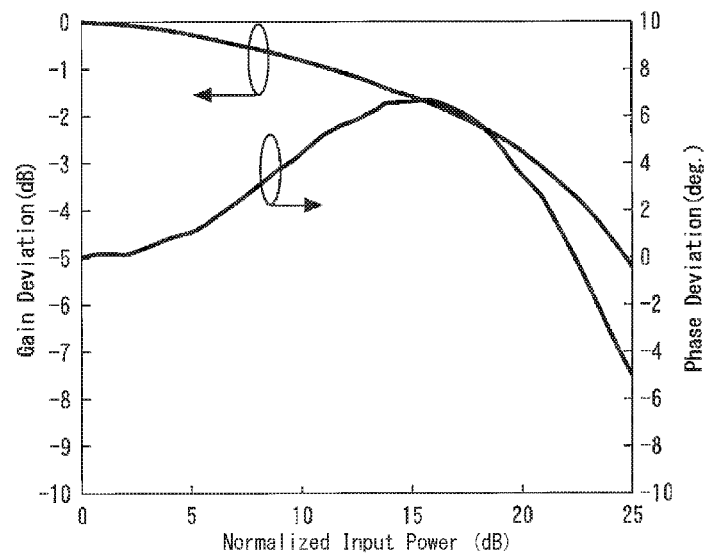
FIG. 8 is diagram illustrating AMAM and AMPM characteristics of an amplifier whose distortion characteristic is compensated.
Figure 9:
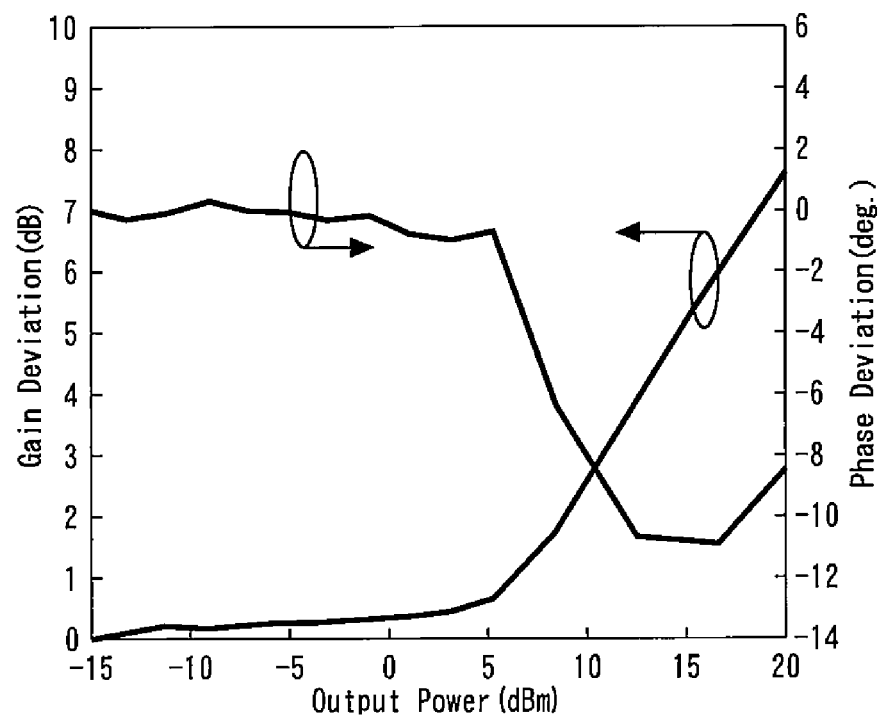
FIG. 9 is a diagram illustrating AMAM and AMPM characteristics of the linearizer according to the third embodiment of the present invention.

FIG. 8 is diagram illustrating AMAM and AMPM characteristics of an amplifier whose distortion characteristic is compensated. While AMAM decreases monotonously, AMPM increases once and then decreases. FIG. 9 is a diagram illustrating AMAM and AMPM characteristics of the linearizer according to the third embodiment of the present invention. Insertion of the inductor L allows the AMPM characteristic of the linearizer to be inverted. Thus, the linearizer of the present embodiment allows the AMPM characteristic of the amplifier to be compensated up to a saturation region (region after AMPM is inverted).

Fourth Embodiment

Figure 10:
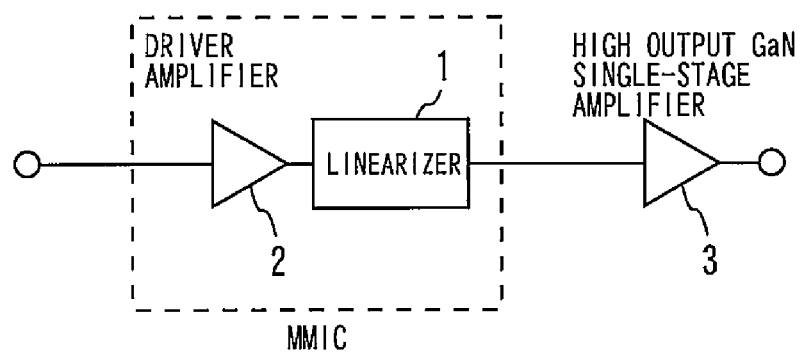
FIG. 10 is a block diagram illustrating a linearizer according to a fourth embodiment of the present invention.

FIG. 10 is a block diagram illustrating a linearizer according to a fourth embodiment of the present invention. A driver amplifier 2 having a GaN-based transistor (e.g., GaN-HEMT) is provided upstream of the linearizer 1 according to any one of the first to third embodiments. A high output GaN single-stage amplifier 3 is provided downstream of the linearizer 1. The driver amplifier 2 supplies an output signal to an input terminal IN of the linearizer 1. Exciting the linearizer 1 by an output signal of the driver amplifier 2 allows the linearizer to operate.

As shown in FIG. 8, although higher output of the GaN-based amplifier can be expected, the gain slowly deteriorates due to GaN-specific soft compression. The linearizer 1 is needed to compensate for this, but since the downstream stage has high output, the output of the linearizer 1 also needs to be kept high. For this purpose, a GaN-based diode D may be adopted. However, since a rising voltage of the GaN-based diode is approximately 1.0 V, which is by 0.3 V higher than 0.7 V of a conventional GaAs-based diode, large input power is necessary at the rise of the gain of the linearizer. Since GaN-HEMT has a higher power density than GaAs-HEMT, if a GaN-based transistor is used for the driver amplifier 2, it is possible to sufficiently drive the linearizer 1.

Moreover, since the present embodiment can be implemented through an HEMT process without requiring any diode D dedicated process, it is possible to integrate the linearizer 1 and the driver amplifier 2 as an MMIC and reduce the circuit area.

Obviously many modifications and variations of the present invention are possible in the light of the above teachings. It is therefore to be understood that within the scope of the appended claims the invention may be practiced otherwise than as specifically described.

The entire disclosure of Japanese Patent Application No. 2014-107276, filed on May 23, 2014 including specification, claims, drawings and summary, on which the Convention priority of the present application is based, is incorporated herein by reference in its entirety.

What is claimed is:
1. A linearizer comprising:
an input terminal;
an output terminal;
a connection point connected between the input terminal and the output terminal;
a diode having an anode directly connected to the connection point;
a voltage terminal; and
a resistor directly connected between the voltage terminal and the connection point, wherein 0 V is applied to the voltage terminal, and
wherein the linearizer is not biased by a DC voltage above ground.

2. The linearizer according to claim 1, wherein the voltage terminal is grounded.

3. The linearizer according to claim 1, further comprising:
a first capacitor connected between the input terminal and the connection point; and
a second capacitor connected between the connection point and the output terminal.

4. The linearizer according to claim 1, wherein the diode has a HEMT structure.

5. The linearizer according to claim 1, further comprising an inductor connected in series to the diode.

6. The linearizer according to claim 1, further comprising a driver amplifier having a GaN-based transistor and supplying an output signal to the input terminal,
wherein the diode is a GaN-based diode.

\* \* \* \* \*